United States Patent
Kojima

(10) Patent No.: US 7,430,142 B2
(45) Date of Patent: Sep. 30, 2008

(54) SKEW ADJUSTING CIRCUIT AND SEMICONDUCTOR INTEGRATED CIRCUIT

(75) Inventor: Takashi Kojima, Tokyo (JP)

(73) Assignee: NEC Corporation, Tokyo (JP)

( * ) Notice: Subject to any disclaimer, the term of this patent is extended or adjusted under 35 U.S.C. 154(b) by 614 days.

(21) Appl. No.: 11/181,918

(22) Filed: Jul. 15, 2005

(65) Prior Publication Data

US 2005/0251712 A1    Nov. 10, 2005

Related U.S. Application Data

(62) Division of application No. 10/013,497, filed on Dec. 13, 2001, now Pat. No. 6,944,801.

(30) Foreign Application Priority Data

Dec. 20, 2000   (JP) ............................. 2000-387599

(51) Int. Cl.
*G11C 7/00* (2006.01)
(52) U.S. Cl. ................. 365/194; 365/189.12
(58) Field of Classification Search ................ 365/194, 365/189.01, 189.12, 240
See application file for complete search history.

(56) References Cited

U.S. PATENT DOCUMENTS

| 6,032,282 | A | * | 2/2000 | Masuda et al. .............. 714/744 |
| 6,335,647 | B1 | | 1/2002 | Nagano |
| 6,570,428 | B1 | | 5/2003 | Liao et al. |

FOREIGN PATENT DOCUMENTS

| JP | 1-149154 A | 6/1989 |
| JP | 5-45418 A | 2/1993 |
| JP | H10-164037 A | 6/1998 |
| JP | H10-171549 A | 6/1998 |
| JP | H11-219323 A | 8/1999 |
| JP | 11-316619 A | 11/1999 |
| JP | H-11-316619 A | 11/1999 |
| JP | 2000-250651 A | 9/2000 |

* cited by examiner

*Primary Examiner*—Son Dinh
(74) *Attorney, Agent, or Firm*—Sughrue Mion, PLLC

(57) ABSTRACT

An output signal of a flip flop at an output stage is supplied to delay gates connected in series thereto. A selector selects the output signal of the flip flop at the output stage or an output signal of one of the delay gates and supplies the selected signal to an external device. A signal to be selected by the selector depends on the value of data stored in a selector value setting register. When a skew adjustment is performed, the output signal of the flip flop at the output stage is held in a write data holding register. The signal supplied to the external device is held in a read data buffer through an input/output register of the external device. Until the value of the signal stored in the write data holding register matches the value of the signal held in the read data buffer, the value of the data stored in the selector value setting register is varied.

2 Claims, 3 Drawing Sheets

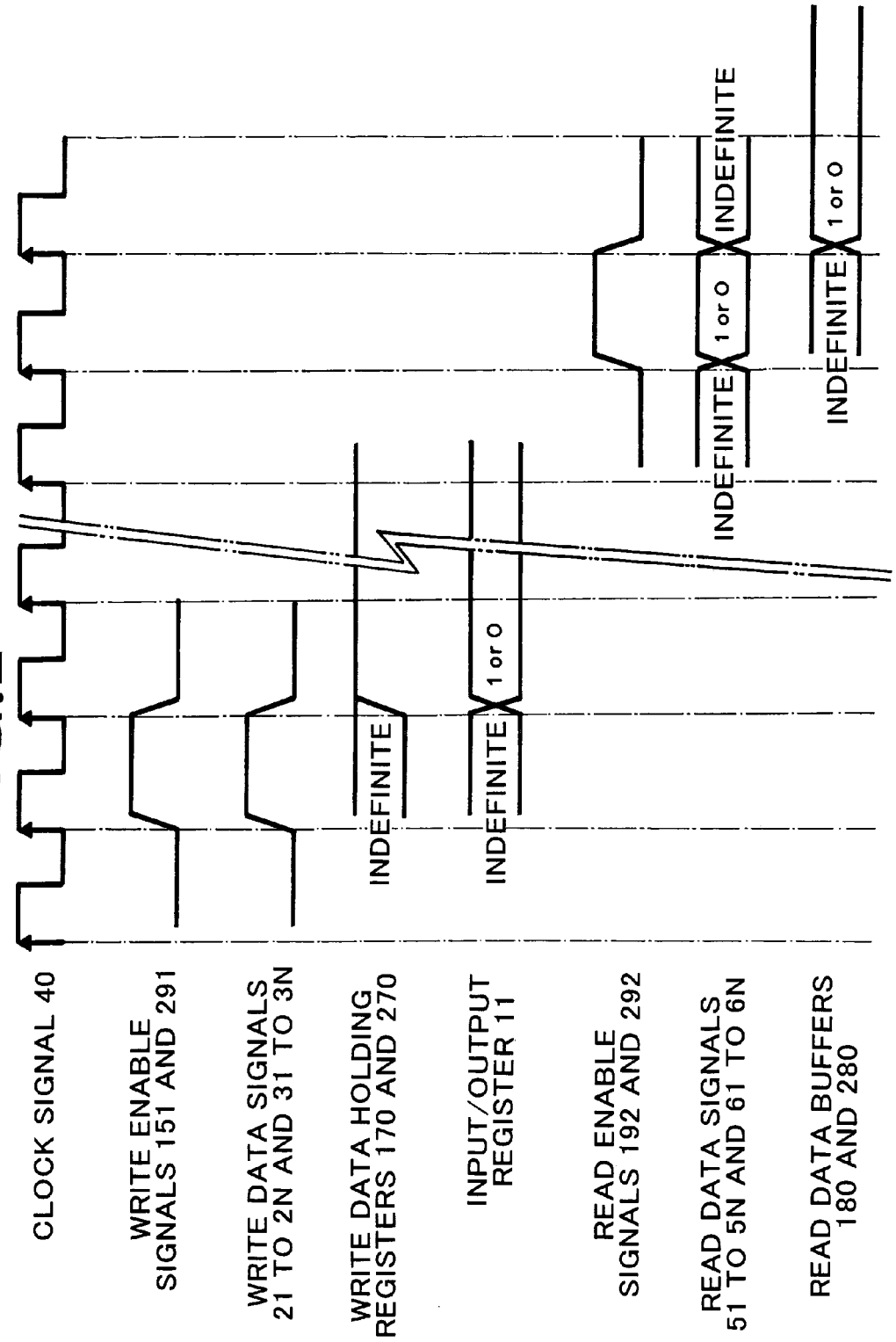

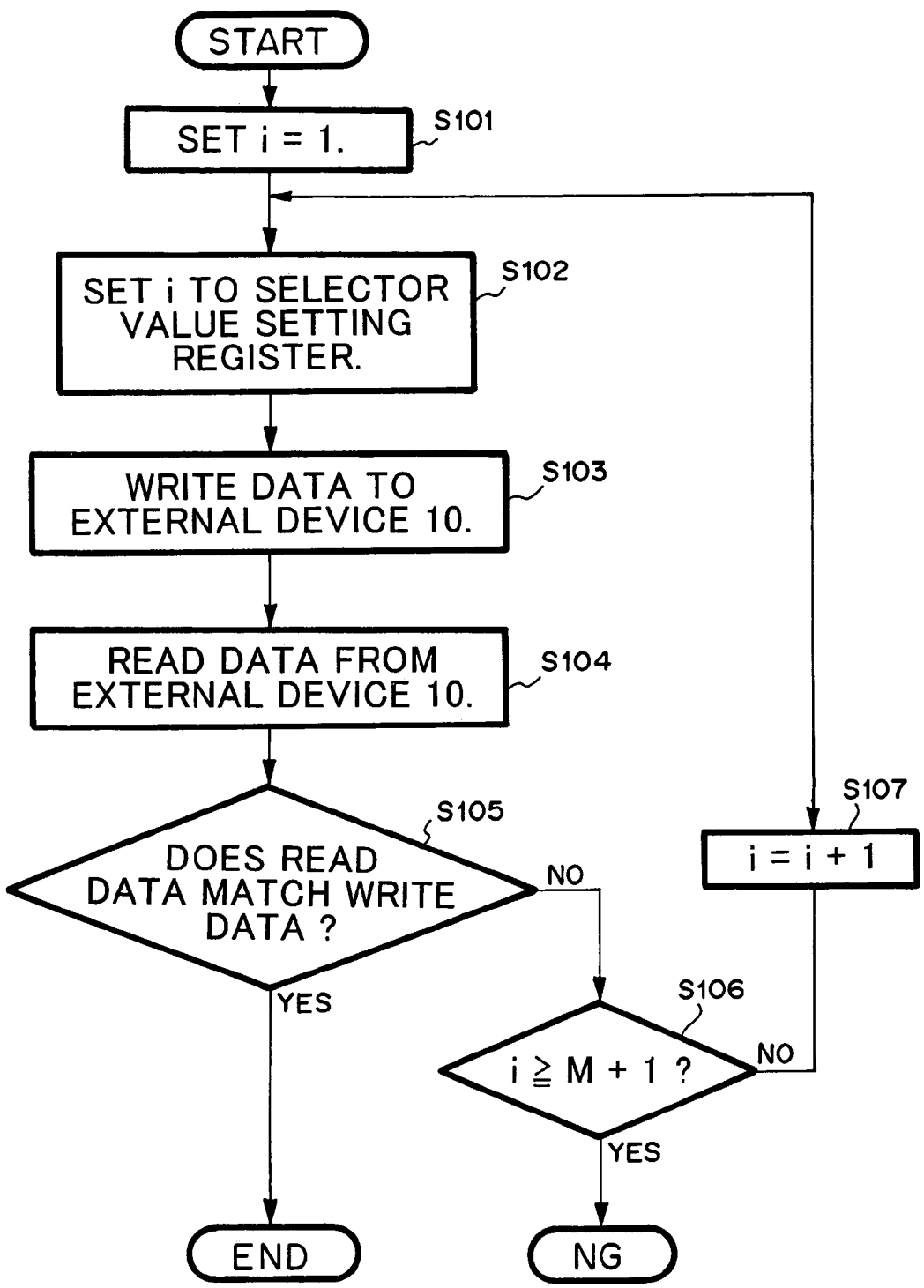

SKEW ADJUSTING CIRCUIT AND SEMICONDUCTOR INTEGRATED CIRCUIT

This is a divisional of application Ser. No. 10/013,497 filed Dec. 13, 2001 now U.S Pat. No. 6,944,801, the entire disclosure of which is incorporated herein by reference.

BACKGROUND OF THE INVENTION

1. Field of the Invention

The present invention relates to a skew adjusting circuit, and in particular, to a skew adjusting circuit for adjusting a skew of a data signal supplied from a semiconductor integrated circuit to an external device against a clock.

2. Description of the Prior Art

In a system that has a plurality of nodes (each of which is composed of an IC), an external device, and a managing CPU that manages the operations and states of the plurality of nodes, when clock signals and data signals are supplied from the plurality of nodes to the external device, it may be necessary to adjust skews of signals between the plurality of nodes and the external device.

In recent years, since the widths of data buses for CPUs, peripheral circuits, and so forth are becoming large, the number of lines for data bit signals contained in data buses is increased. Thus, it is difficult to route all data bit lines in the same length. Consequently, it becomes important to adjust skews of data bit signals.

As a conventional skew adjusting method, while analog waveforms of node outputs are being observed using a measuring device, skews of a plurality of nodes are adjusted so that the specifications of the external device are satisfied. In addition, a clock is supplied from an external clock driver to the external device.

However, in the conventional skew adjusting method, it is troublesome to adjust skews using a measuring device.

Moreover, in recent years, as the speeds of clocks used in CPUs, peripheral circuits, and so forth become high, it is becoming difficult to adjust skews of a plurality of node outputs at a desired timing and supply a clock from a clock driver to the external device at a desired timing.

SUMMARY OF THE INVENTION

Therefore, an object of the present invention is to provide a skew adjusting circuit that is used with a high speed clock system and that allows a skew to be automatically adjusted without need to use a measuring device.

According to a first aspect of the present invention, there is provided a skew adjusting circuit for adjusting a skew of a signal that is output from a first circuit and that is supplied to a second circuit, comprising: a delaying circuit for delaying the signal that is output from the first circuit, the delaying circuit having at least one tap; a selector for selecting the signal that is output from the first circuit or a signal that is output from any tap of the delaying circuit and supplying the selected signal to the second circuit; and controlling means for determining the signal selected by the selector so that the value of the signal that is output from the first circuit matches the value of the signal supplied to the second circuit in the same clock period.

In the skew adjusting circuit, the controlling means may comprise: a first register for sampling and holding the signal that is output from the first circuit; a second register for sampling and holding the signal that is output from the second circuit; and means for comparing the value of the signal held in the first register with the value of the signal held in the second register.

In the skew adjusting circuit, the controlling means may further comprise: means for changing a signal selected by the selector if the value of the signal held in the first register does not match the value of the signal held in the second register.

In the skew adjusting circuit, the controlling means may further comprise: means for not changing a signal selected by the selector if the value of the signal held in the first register matches the value of the signal held in the second register.

In the skew adjusting circuit, the second circuit may comprise an input/output register, and the signal supplied to the second circuit may be supplied to the controlling means through the input/output register.

According to a second aspect of the present invention, there is provided a skew adjusting method for adjusting a skew of a signal that is output from a first circuit and that is supplied to a second circuit, comprising the steps of: delaying the signal that is output from the first circuit; selecting the signal that is output from the first circuit or a delayed signal and supplying the selected signal to the second circuit; and determining the signal selected at the selecting step so that the value of the signal that is output from the first circuit matches the value of the signal supplied to the second circuit in the same clock period.

In the skew adjusting method, the delaying step may be performed by a plurality of unit delaying steps for delaying the signal with different time periods, and the selecting step may be performed by selecting the signal that is output form the first circuit or a signal delayed at any unit delay step and supplying the selected signal to the second circuit.

In the skew adjusting method, the determining step may comprise the step of: comparing the value of a signal held in a first register for sampling and holding the signal that is output from the first circuit with the value of a signal held in a second register for sampling and holding the signal supplied to the second circuit.

In the skew adjusting method, the determining step may further comprise the step of changing a signal selected at the selecting step when the value of the signal held in the first register does not match the value of the signal held in the second register.

In the skew adjusting method, the controlling step may further comprise the step of: not changing a signal selected at the selecting step when the value of the signal held in the first register matches the value of the signal held in the second register.

The skew adjusting method may further comprise the steps of: writing the signal supplied to the second circuit to an input/output register thereof; and reading a signal from the input/output register, and the controlling step may be performed by treating the signal that is read from the input/output register as the signal supplied to the second circuit.

According to a third aspect of the present invention, there is provided a semiconductor integrated circuit, comprising: a delaying circuit for delaying a signal that is output from an internal circuit, the delaying circuit having at least one tap; a selector for selecting the signal that is output from the internal circuit or a signal that is output from any tap of the delaying circuit and supplying the selected signal to the outside of the semiconductor integrated circuit; and a register for holding data for determining the signal to be selected by the selector.

The semiconductor integrated circuit may further comprise: a first register for sampling and holding the signal that is output from the internal circuit; and a second register for sampling and holding the signal supplied from the outside.

These and other objects, features and advantages of the present invention will become more apparent in light of the following detailed description of the best mode embodiment thereof, as illustrated in the accompanying drawings.

BRIEF DESCRIPTION OF DRAWINGS

FIG. 2 is a timing chart for explaining the operation of the skew adjusting circuit according to the embodiment of the present invention; and FIG. 3 is a flow chart for explaining a skew adjusting method according to the embodiment of the present invention.

DESCRIPTION OF PREFERRED EMBODIMENT

Figure 1:
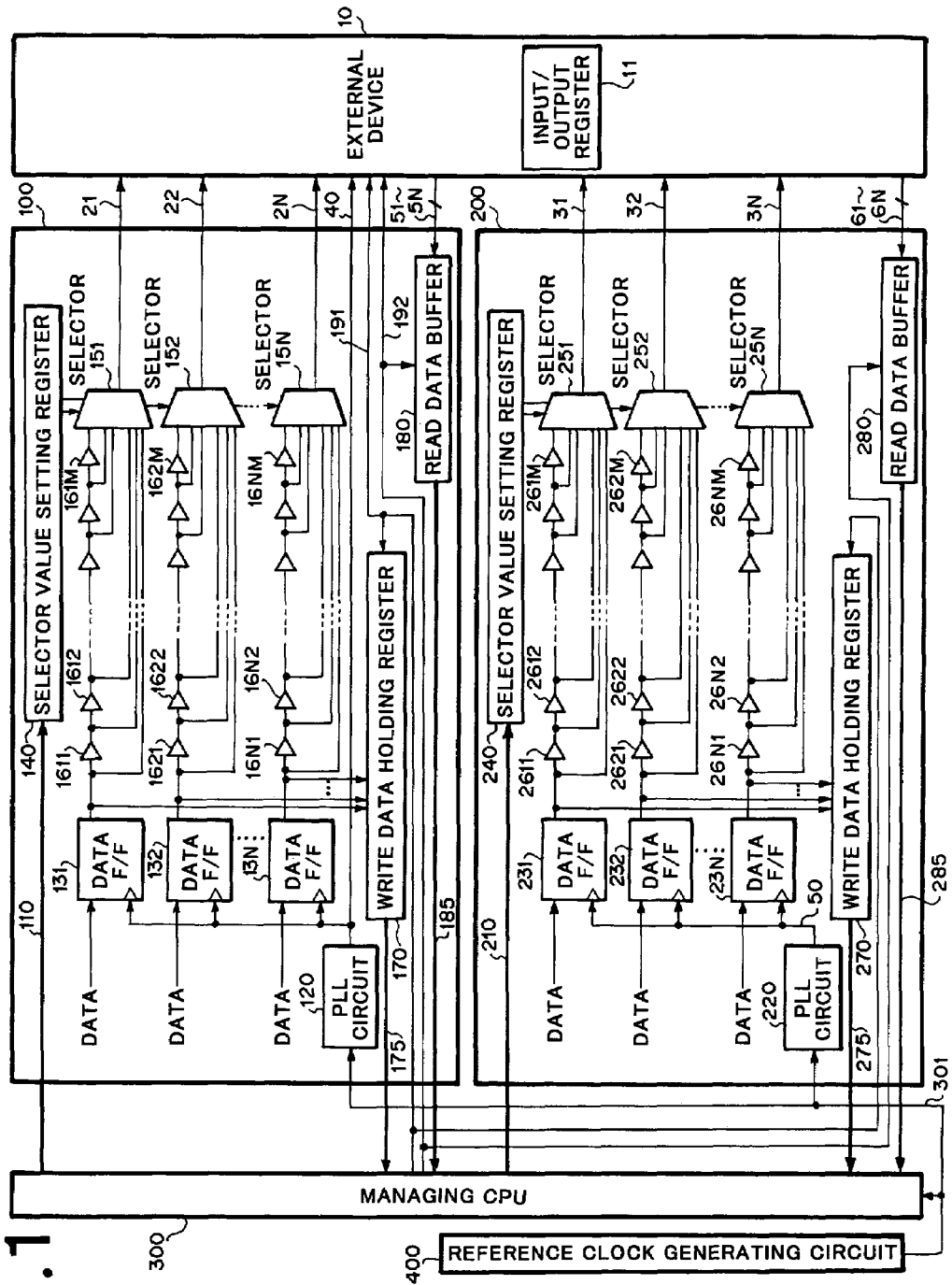
FIG. 1 is a block diagram showing the structure of a system that has a skew adjusting circuit according to an embodiment of the present invention.

Next, with reference to the accompanying drawings, an embodiment of the present invention will be described.

Referring to FIG. 1, the system according to the embodiment of the present invention has an external device 10, a managing CPU 300, and nodes 100 and 200.

The external device 10 inputs write data signals 21, 22, . . . , and 2N from the node 100. In addition, the external device 10 inputs write data signals 31, 32, . . . , and 3N from the node 200. The external device 10 stores these input signals to an input/output register 11. The write data signals 21, 22, . . . , and 2N synchronize with a clock signal 40 that a PLL circuit 120 of the node 100 generates. The write data signals 31, 32, . . . , and 3N synchronize with a clock signal 50 that a PLL circuit 220 of the node 200 generates. In this example, the PLL circuit 120 multiplies the frequency of a reference clock signal 301 that a reference clock generating circuit 400 generates so as to generate the clock signal 40. Likewise, the PLL circuit 120 multiplies the frequency of the reference clock signal 301 so as to generate the clock signal 50. A jitter between the clock signal 40 and the clock signal 50 is so small that it can be ignored. In this example, there is a problem of a skew instead of a jitter. In other words, there are skews between signal lines between the node 100 and the external device 10, skews between signal lines between the node 200 and the external device 10, and skews between signal lines between the node 100 and the external device 10 and signal lines between the node 200 and the external device 10.

In addition, the input/output register 11 of the external device 10 stores the write data signals 21, 22, . . . , and 2N and the write data signals 31, 32, . . . , and 3N with a write clock of the clock signal 40. Data stored in the input/output register 11 is output as read data signals 51, 52, . . . , and 5N and read data signals 61, 62, . . . , and 6N to the managing CPU 300 through read data buffers 180 and 190.

The managing CPU 300 sets data of a predetermined value to a selector value setting register 140 so that delay amounts of the write data signals 21, 22, . . . , and 2N are set to the node 100. In addition, the managing CPU 300 sets data of a predetermined value to a selector value setting register 240 so that the delay amounts of the write data signals 31, 32, . . . , and 3N are set to the node 200. In addition, the managing CPU 300 controls the write data signals 21, 22, . . . , and 2N and the write data signals 31, 32, . . . , and 3N to be written to the input/output register 11, data signals corresponding to the write data signals 21, 22, . . . , and 2N to be written to a write data holding register 170, and data signals corresponding to the write data signals 31, 32, . . . , and 3N to be written to a write data holding register 270 with a data write signal 191. In addition, the managing CPU 300 controls the read data signals 51, 52, . . . , and 5N and the read data signals 61, 62, . . . , and 6N to be read from the input/output register 11, the read data signals 51, 52, . . . , and 5N to be written to the read data buffer 180, and the read data signals 61, 62, . . . , and 6N to be written to the read data buffer 280 with a data read signal 192. Moreover, the managing CPU 300 determines whether or not data written to the write data holding register 170 matches data written to the read data buffer 180 bit by bit. In addition, the managing CPU 300 determines whether or not data written to the write data holding register 270 matches data written to the read data buffer 280 bit by bit.

The node 100 has the PLL circuit 120, the data flip flops (F/Fs) 131, 132, . . . , and 13N, the selector value setting register 140, selectors 151, 152, . . . , and 15N, delay gates 1611, 1612, . . . , and 161M, 1621, 1622, . . . , 162M, . . . , and 16N1, and 16N2, . . . , and 16NM, the write data holding register 170, and the read data buffer 180.

The PLL circuit 120 multiplies the frequency of the reference clock signal 301 and outputs the multiplied clock signal as a clock signal used for the node 100 and the external device 10.

The data flip flops 131, 132, . . . , and 13N are disposed upstream of outputs to the external device 10. The data flip flops 131, 132, . . . , and 13N sample data that is output from the node 100 to the external device 10 at a timing of the clock signal that is output from the PLL circuit 120.

The delay gates 1611, 1612, . . . , and 161M, 1621, 1622, . . . , and 162M, . . . , 16N1, 16N2, . . . , and 16NM are gates with predetermined delays so as to adjust the output signals of the data flip flops 131, 132, . . . , and 13N at desired timings. The delay gates 1611, 1612, . . . , and 161MN are connected in series to the data flip flop 131. The delay gates 1621, 1622, . . . , and 162M are connected in series to an output of the data flip flop 132. Likewise, the delay gates 16N1, 16N2, . . . , and 16NM are connected in series to an output of the data flip flop 13N.

The selectors 151, 152, . . . , and 15N are selectors that select delay amounts of data. The selector 151 selects one of the outputs of the data flip flop 131 and the delay gates 1611, 1612, . . . , and 161M and outputs the selected output. The selector 152 selects one of the outputs of the data flip flop 132 and the delay gates 1621, 1622, . . . , and 162N and outputs the selected output. The selector 15N selects one of the outputs of the data flip flop 13N and the delay gates 16N1, 16N2, . . . , and 16NM and outputs the selected output.

The selector value setting register 140 causes the selectors 151, 152, . . . , and 15N to select respective outputs corresponding to a setup signal 110 received from the managing CPU 300.

The write data holding register 170 samples and holds output data of the data flip flops 131, 132, . . . , and 13N and outputs the sampled and held data as a held data signal 175 to the managing CPU 300.

The read data buffer 180 samples and holds the read data signals 51, 52, . . . , and 5N that are read from the external device 10 and outputs the sampled and held signals as a read data signal 185 to the managing CPU 300.

Likewise, the node 200 has the PLL circuit 220, data flip flops (F/Fs) 231, 232, . . . , and 23N, the selector value setting register 240, selectors 251, 252, . . . , and 25N, delay gates 2611, 2612, . . . , and 261M, 2621, 2622, . . . , and 262M, . . . , 26N1, 26N2, . . . , and 26NM, the write data holding register 270, and the read data buffer 280.

The PLL circuit 220 multiplies the frequency of the reference clock signal and outputs the multiplied clock signal as a clock signal used for the node 200.

The data flip flops 231, 232, ..., and 23N are disposed upstream of outputs to the external device 10. The data flip flops 231, 232, ..., and 23N sample data that is output from the node 200 to the external device 10 at a timing of the clock signal that is output from the PLL circuit 220.

The delay gates 2611, 2612, ..., and 261M, 2621, 2622, ..., and 262M, ..., 26N1, 26N2, ..., and 26NM are gates with predetermined delays so as to adjust the output signals of the data flip flops 231, 232, ..., and 23N at desired timings. The delay gates 2611, 2612, ..., and 26NM are connected in series to the data flip flop 231. The delay gates 2621, 2622, ..., and 262M are connected in series to an output of the data flip flop 232. Likewise, the delay gates 26N1, 26N2, ..., and 26NM are connected in series to an output of the data flip flop 23N.

The selectors 251, 252, ..., and 25N are selectors that select delay amounts of data. The selector 251 selects one of the outputs of the data flip flop 231 and the delay gates 2611, 2612, ..., and 261M and outputs the selected output. The selector 252 selects one of the outputs of the data flip flop 232 and the delay gates 2621, 2622, ..., and 262N and outputs the selected output. The selector 25N selects one of the outputs of the data flip flop 23N and the delay gates 26N1, 26N2, ..., and 26NM and outputs the selected output.

The selector value setting register 240 causes the selectors 251, 252, ..., and 25N to select respective outputs corresponding to a setup signal 210 received from the managing CPU 300.

The write data holding register 270 samples and holds output data of the data flip flops 231, 232, ..., and 23N and outputs the sampled and held data as a held data signal 275 to the managing CPU 300.

The read data buffer 280 samples and holds the read data signals 61, 62, ..., and 6N that are read from the external device 10 and outputs the sampled and held signals as a read data signal 285 to the managing CPU 300.

Next, the operation of the embodiment of the present invention will be described with an example of the node 100.

In the node 100, outputs of all the data flip flops 131, 132, ..., and 13N are successively adjusted. Each of the selectors 151, 152, ..., and 15N outputs a signal selected from (M+1) inputs. The skew adjustment is performed when an initial test is performed in the system. The initial test may be a test for verifying a circuit design or a test before delivery.

Referring to FIG. 2, when a test is performed, in a write phase for each delay time adjustment amount, the signal level of the write enable signal 191 is set to the active level (in FIG. 2, high active) for only one clock period. Before and after the clock period, the signal level of the write enable signal 191 is set to the inactive level. Only in the clock period in which the signal level of the write enable signal 191 is set to the active level, the signal levels of the write data signals 21, 22, ..., and 2N are set to the high levels. Before and after the clock period, the signal levels of the write data signals 21, 22, ..., and 2N are set to the low levels. In this case, after the signal level of the write enable signal 191 is set to the active level, the signal level of the write data holding register 170 is securely kept in the high level. However, due to a skew, the signal level of the input/output register 11 is not always kept in the high level. In other words, the signal level of the input/output register 11 is kept in the high level or the low level.

When a test is performed, in a read phase for each delay time adjustment amount, only in one clock period, the signal level of the read enable signal 192 is set to the active level (in FIG. 2, high active level). Before and after the clock period, the signal level of the read enable signal 192 is set to the inactive level. In this case, in the clock period in which the signal level of the read enable signal 192 is set to the active level, a data signal with a value held in the input/output register 11 is output as read data signals 51, 52, ..., and 5N. After the next clock period, the data signal with the value is held in the read data buffer 180.

Alternatively, when a test is performed, in the write phase for each delay time adjustment amount, for only one clock period, the signal level of the write enable signal 191 is set to the active level (in FIG. 2, high active level). Before and after the clock period, the signal level of the write enable signal 191 is set to the inactive level. Only in the clock period in which the write enable signal 191 is set to the active level, the signal levels of the write data signals 21, 22, ..., and 2N are set to the low levels. Before and after the clock period, the signal levels of the write data signals 21, 22, ..., and 2N are set to the high levels. After the clock period in which the signal level of the write enable signal 191 is set to the active level, the signal level of the write data holding register 170 is securely kept in the low level. However, due to a skew, the signal level of the input/output register 11 is not always kept in the low level. In other words, the signal level of the input/output register 11 may be in the low level or the high level.

When a test is performed, in the read phase for each delay time adjustment amount, for only one clock period, the signal level of the read enable signal 192 is set to the active level (in FIG. 2, high active level). Before and after the clock period, the signal level of the read enable signal 192 is set to the inactive level. At that point, in the clock period in which the signal level of the read enable signal 192 is set to the active level, a data signal with a value held in the input/output register 11 is output as the read data signals 51, 52, ..., and 5N from the input/output register 11. After the next clock period, the data signal with the value is stored in the read data buffer 180.

Thus, depending on whether or not the value of a data signal written to the write data holding register 170 matches the value of a data signal written to the read data buffer 180, it can be determined whether or not the write data signals 21, 22, ..., and 2N have been correctly written to the input/output register 11.

Next, with reference to FIG. 3, the overall operation of the system will be described. The operation shown in FIG. 3 is performed for each of the write data signals 21, 22, ..., 2N, 31, 32, ..., and 3N.

Referring to FIG. 3, at step S101, an initial value "1" is set to an integer variable i. At step S102, the variable i is set to a selector value setting register corresponding to a data flip flop to be adjusted. Thus, the initial value has been set to the selector corresponding to the data flip flop to be adjusted. In this example, the output of the delay gate at the last stage is selected from delay gates connected in series. When the data flip flop 131 is adjusted, the output of the delay gate 161M is selected.

At step S103, predetermined data is written from the data flip flop to be adjusted to the input/output register 11 of the external device 10. The data signal written to the input/output register 11 of the external device 10 has been delayed by the relevant selector corresponding to the setting of the selector value setting register 140. At that point, the data is also stored to the write data holding register 170. These steps are performed in the above-described write phase.

At step S104, data that has been written to the input/output register 11 of the external device 10 at step S103 is read and written to the read data buffer 180. This step is the above-described read phase.

At step S105, the value of the bit held in the write data holding register 170 and the value of the bit written in the read data buffer 180 are compared. When the determined result at step S105 represents that they match, the skew adjustment for the output of the data flip flop to be adjusted is completed. As a result, the process is completed.

When the determined result at step S105 represents that they do not match, the flow advances to step S106. At step S106, it is determined whether or not the variable i is equal to or greater than (M+1). When the determined result at step S106 represents that the variable i is equal to or greater than (M+1), assuming that the skew of the output of the data flip flop to be adjusted cannot be adjusted, the process is completed. When the determined result at step S106 represents that the variable i is less than (M+1), the flow advances to step S107. At step S107, the variable i is incremented by 1. Thereafter, the flow returns to step S102.

In this example, whenever the variable i is incremented by 1, the output of the delay gate on the immediately preceding stage is selected from delay gates connected in series by the selector. Until the skew adjustment is completed or the variable i matches (M+1), the loop from step S102 to step S107 is repeated.

According to the embodiment of the present invention, with a plurality of delay gates connected in series (according to the embodiment, M delay gates), a plurality of signals with different delays are generated. Data is written to and read from the input/output register 11 of the external device 10. The skew adjustment is performed so that the write data matches the read data (namely, data is correctly written). Thus, even if the system operates with a high speed clock, the skew adjustment can be easily performed without need to use a measuring device. In addition, the skew adjustment can be performed for each data flip flop (namely, for each bit), the skew adjustment for many data signals can be quickly performed for each bit.

According to the above-described embodiment, the skew adjustment is successively performed for data flip flops of all nodes. Alternatively, the skew adjustment may be performed simultaneously for a plurality of data flip flops.

According to the above-described embodiment, the delay gates that are connected in series are successively selected from the last stage so as to determine whether or not write data matches read data. However, according to the present invention, the delay gates may be selected in the reverse order or in any order.

Although the present invention has been shown and described with respect to the best mode embodiment thereof, it should be understood by those skilled in the art that the foregoing and various other changes, omissions, and additions in the form and detail thereof may be made therein without departing from the spirit and scope of the present invention.

What is claimed is:

1. A semiconductor integrated circuit, comprising:
   a delaying circuit for delaying a signal that is output from an internal circuit, said delaying circuit having at least one tap;
   a selector for selecting the signal that is output from the internal circuit or a signal that is output from any tap of said delaying circuit and supplying the selected signal to the outside of the semiconductor integrated circuit; and
   a register for holding data for determining the signal to be selected by said selector.

2. A semiconductor integrated circuit as set forth in claim 1, further comprising:
   a first register for sampling and holding the signal that is output from the internal circuit; and
   a second register for sampling and holding the signal supplied from the outside.

* * * * *